(12) United States Patent
Gouda et al.

(10) Patent No.: US 11,603,982 B2
(45) Date of Patent: Mar. 14, 2023

(54) BROADBAND LIGHT-EMITTING DEVICE

(71) Applicant: PHOENIX ELECTRIC CO., LTD., Hyogo (JP)

(72) Inventors: Tetsuya Gouda, Hyogo (JP); Yuta Sakimoto, Hyogo (JP)

(73) Assignee: PHOENIX ELECTRIC CO., LTD., Hyogo (JP)

( * ) Notice: Subject to any disclaimer, the term of this patent is extended or adjusted under 35 U.S.C. 154(b) by 0 days.

(21) Appl. No.: 17/811,501

(22) Filed: Jul. 8, 2022

(65) Prior Publication Data
US 2023/0023405 A1 Jan. 26, 2023

(30) Foreign Application Priority Data

Jul. 20, 2021 (JP) .............................. JP2021-119268

(51) Int. Cl.
*F21V 9/30* (2018.01)
*F21V 9/08* (2018.01)
*F21Y 113/10* (2016.01)

(52) U.S. Cl.
CPC .................. *F21V 9/30* (2018.02); *F21V 9/08* (2013.01); *F21Y 2113/10* (2016.08)

(58) Field of Classification Search
CPC .......................... F21V 9/00–45; F21Y 2113/10
See application file for complete search history.

(56) References Cited

U.S. PATENT DOCUMENTS 11,419,278 B2 * 8/2022 Li ...................... H01L 25/0753
2021/0249569 A1 8/2021 Fukuda

FOREIGN PATENT DOCUMENTS

| JP | 2012104245 A | 5/2012 |
| JP | 2020071381 A | 5/2020 |
| WO | 2019240150 A1 | 12/2019 |

OTHER PUBLICATIONS

Office Action dated Jan. 10, 2023 for the corresponding Taiwanese patent application No. 111127087, with English translation.

* cited by examiner

*Primary Examiner* — Jason M Han
(74) *Attorney, Agent, or Firm* — Lucas & Mercanti, LLP

(57) ABSTRACT

A broadband light-emitting device is composed of a substrate, a solid light source that is installed on a front face of the substrate and emits light at an upper face thereof, a near-infrared fluorescent material disposed in direct contact with the front face of the substrate in the vicinity of the solid light source, and a visible light fluorescent material disposed on a region ranging from the upper face of the solid light source to an upper face of the near-infrared fluorescent material. Besides, the near-infrared fluorescent material contains fluorescent particles exhibiting fluorescence in a near-infrared wavelength band with a peak wavelength of 700 nm and a wavelength width at half maximum of 100 nm or greater.

9 Claims, 3 Drawing Sheets

BROADBAND LIGHT-EMITTING DEVICE

CROSS REFERENCE OF RELATED APPLICATION

This application claims the priority of Japanese Patent Application No. 2021-119268 filed on Jul. 20, 2021, which are incorporated by reference herein.

BACKGROUND OF THE INVENTION

Field of the Invention

The present invention relates to a broadband LED (Light-Emitting Diode) having a peak wavelength in a broad wavelength band.

Background Art

In recent years, widespread use of near-infrared light has emerged in the fields of medical care, beauty care, health care, and so forth that component analysis is conducted.

As a light source for emitting near-infrared light, halogen lamps have been generally used so far; however, LEDs have increasingly come to be used nowadays.

The LEDs emit light in which a large amount of heat is not contained. Besides, many of the LEDs are drivable at a low voltage (supplied from, for instance, a dry cell or so forth). Because of this, the LEDs can contribute to downsizing and portability for devices.

Trials have been done to use the LEDs described above for spectroscopes. In general, the LEDs are narrower in spectral distribution than the halogen lamps. Hence, in attempt to use the LEDs for the spectroscopes, it has been required for a single spectroscope to use a plurality of types of LEDs that emit rays of lights different in peak wavelength from each other.

By contrast, International Patent Application Publication No. WO2019/240150 discloses a light-emitting device that includes a solid light source and a fluorescent film. The solid light source emits light having a peak wavelength in a wavelength band of 480 nm or less. The fluorescent film contains at least one type of near-infrared fluorescent material. The near-infrared fluorescent material is excited by the light emitted from the solid light source and emits light having a peak wavelength in a wavelength band of greater than 700 nm. Besides, the spectrum of the light emitted from the near-infrared fluorescent material has a full width at half maximum of 100 nm or greater in the wavelength band including the peak wavelength.

However, with increase in Stokes shift, i.e., a difference between a peak wavelength in incident light (emitted from the solid light source) into the near-infrared fluorescent material and that in longer wavelength light (near-infrared light) emitted from the near-infrared fluorescent material excited by the incident light, the energy of the longer wavelength light per se is reduced; conversely, it is inevitable that large heat is generated in the near-infrared fluorescent material and/or the fluorescent film.

Because of this, the fluorescent material and/or the fluorescent film per se become high in temperature with increase in heat generated therein; consequently, this brings about deterioration in luminous efficiency and reduction in product life.

The present invention has been produced in view of the drawbacks described above. It is an object of the present invention to provide a broadband light-emitting device that a fluorescent material is employed to achieve large Stokes shift with respect to light emitted from a solid light source but the fluorescent material per se can be avoided from becoming high in temperature.

SUMMARY OF THE INVENTION

According to an aspect of the present invention, a broadband light-emitting device is provided. The broadband light-emitting device includes a substrate, a solid light source, a near-infrared fluorescent material, and a visible light fluorescent material. The solid light source is installed on a front face of the substrate and emits light at an upper face thereof. The near-infrared fluorescent material is disposed in direct contact with the front face of the substrate in a vicinity of the solid light source. The visible light fluorescent material is disposed on a region ranging from the upper face of the solid light source to an upper face of the near-infrared fluorescent material. The near-infrared fluorescent material contains fluorescent particles exhibiting fluorescence in a near-infrared wavelength band with a peak wavelength of 700 nm or greater and a wavelength width at half maximum of 100 nm or greater.

Preferably, a height from the front face of the substrate at a position nearest to the solid light source in the near-infrared fluorescent material is less than or equal to a height of the solid light source from the front face of the substrate.

Preferably, the near-infrared fluorescent material is adjacently disposed in surroundings of the solid light source so as to enclose the solid light source.

Preferably, the broadband light-emitting device further includes a wall member disposed to stand upright from the front face of the substrate on a circumferential edge of both the near-infrared fluorescent material and the visible light fluorescent material.

Preferably, the visible light fluorescent material is divided into a plurality of sections so as to enable emission of a plurality of types of visible wavelength light.

Preferably, the solid light source emits light with a peak wavelength of greater than or equal to 340 nm and less than or equal to 600 nm.

Preferably, the broadband light-emitting device emits light with a continuous spectrum in a range from a spectral band of the light emitted by the solid light source to 1500 nm.

Preferably, the broadband light-emitting device emits light with a continuous spectrum in a range from a spectral band of the light emitted by the solid light source to 1200 nm.

Preferably, an LED (Light-Emitting Diode) or a laser diode is used as the solid light source.

Advantageous Effects of Invention

In the broadband light-emitting device according to the present invention, the near-infrared fluorescent material is disposed in direct contact with the front face of the substrate in the surroundings of the solid light source, while the visible light fluorescent material is disposed on a region ranging from the upper face of the solid light source to the upper face of the near-infrared fluorescent material; hence, rays of light emitted from the upper face of the solid light source pass in part through the visible light fluorescent material and are emitted as rays of visible light, whereas the remaining of the rays of light is reflected inside the visible light fluorescent material, then enters the near-infrared fluorescent material, and is emitted as rays of near-infrared light. With this configuration, the broadband light-emitting device can emit broadband light.

Besides, the near-infrared fluorescent material is disposed in direct contact with the front face of the substrate in the surroundings of the solid light source. Hence, large Stokes shift can be achieved with respect to the light emitted from the solid light source. Besides, even when heat is generated in the near-infrared fluorescent material, the near-infrared fluorescent material per se can be avoided from becoming high in temperature, because a large amount of heat is dissipated from the near-infrared fluorescent material to the substrate.

BRIEF DESCRIPTION OF THE DRAWINGS

Referring now to the attached drawings which form a part of this original disclosure.

DETAILED DESCRIPTION OF EMBODIMENTS (Configuration of Broadband Light-Emitting Device 10)

Figure 1:
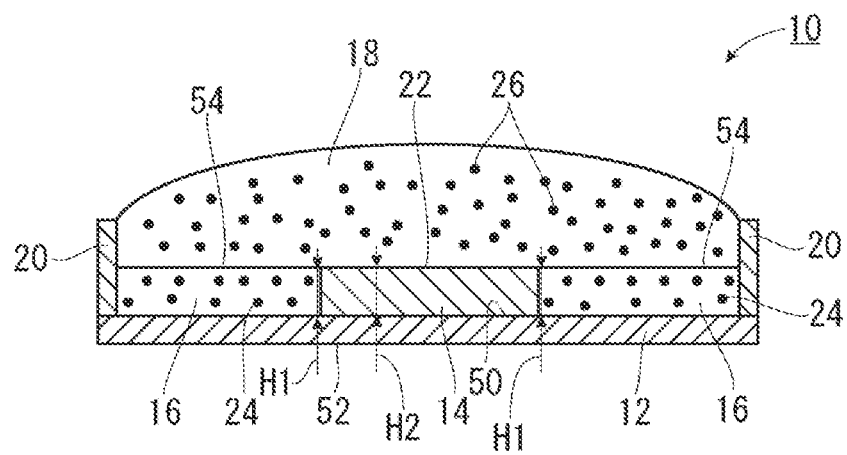
FIG. 1 is a cross-sectional diagram showing a broadband light-emitting device (10) to which the present invention is applied.

A broadband light-emitting device 10 according to an exemplary embodiment to which the present invention is applied will be hereinafter explained. As shown in FIG. 1, the broadband light-emitting device 10 mainly includes a substrate 12, a solid light source 14, a near-infrared fluorescent material 16, a visible light fluorescent material 18, and a wall member 20.

In the present exemplary embodiment, the substrate 12 is a substantially flat plate member and is provided with a circuit (not shown in the drawing) for supplying electric power to the solid light source 14 on either a front face 50 thereof or a back face 52 thereof. Obviously, electric power may be configured to be supplied to the solid light source 14 through an overhead wire (e.g., lead wire) without forming the circuit on either the front face 50 or the back face 52 of the substrate 12.

Besides, in view of advantageous effects of the broadband light-emitting device 10 to be described, the entirety of the substrate 12 is preferably made of a material with as high a thermal conductivity as possible.

The solid light source 14 is a material that emits light with a predetermined waveform when supplied with electric power. For example, an LED (Light-Emitting Diode) or a laser diode can be assumed as the solid light source 14.

Besides, the solid light source 14 is installed on the front face 50 of the substrate 12 and is configured to emit light at an upper face 22 thereof (i.e., a face located on the opposite side of a face opposed to the substrate 12). It should be noted that the upper face 22 (i.e., a light-emitting face) of the solid light source 14 may have a circular shape, or alternatively, a rectangular shape.

Moreover, a peak wavelength of the light emitted from the solid light source 14 is not limited to a specific configuration but is preferably greater than or equal to 340 nm and less than or equal to 600 nm. In general, many of spectroscopes calibrated by halogen lamps have a spectral sensitivity of around 340 nm to around 1200 nm; hence, the peak wavelength of the light emitted from the solid light source 14 is preferably greater than or equal to 340 nm. Besides, in general, a near-infrared fluorescent material, exhibiting large Stokes shift, emits light with a wavelength of 600 nm or less when excited; hence, the peak wavelength of the light emitted from the solid light source 14 is preferably less than or equal to 600 nm.

The near-infrared fluorescent material 16 is a member adjacently disposed in the surroundings of the solid light source 14 so as to enclose the solid light source 14 and contains fluorescent particles 24. Besides, the near-infrared fluorescent material 16 is disposed in direct contact with the front face 50 of the substrate 12.

Furthermore, height H1 is defined as the height from the front face 50 of the substrate 12 at a position nearest to the solid light source 14 in the near-infrared fluorescent material 16 (in the present exemplary embodiment, the near-infrared fluorescent material 16 is adjacently disposed in the surroundings of the solid light source 14; hence, the position refers to a position at which the near-infrared fluorescent material 16 contacts the solid light source 14), whereas height H2 is defined as the height of the solid light source 14 from the front face 50 of the substrate 12. A relation between the height H1 and the height H2 is not limited to a particular configuration; however, it is preferable to set the height H1 and the height H2 to be equal, or alternatively, set the height H1 to be lower than the height H2. This configuration is preferable because of the following reason: when the height H1 is unintentionally higher than the height H2, the near-infrared fluorescent material 16 inevitably flows out and is disposed on the solid light source 14 as well, whereby the near-infrared fluorescent material 16 on the solid light source 14 becomes high in temperature and brings about early deterioration.

The fluorescent particles 24 are excited by light with a predetermined peak wavelength and emit light with a wavelength longer than the peak wavelength (i.e., light similar to infrared light). For example, when excited by light with a peak wavelength of 365 nm, which is popular as light emitted from an LED exemplified as the solid light source 14, the fluorescent particles 24 are configured to emit light in a near-infrared wavelength band with a peak wavelength of 700 nm or greater and a wavelength width at half maximum of 100 nm or greater.

As disclosed in International Patent Application Publication No. WO2019/240150, particles containing europium with an oxidation number of +2 can be exemplified as the fluorescent particles 24 exhibiting large Stokes shift as described above. Obviously, the fluorescent particles 24 are not limited to this example; any suitable particles may be employed as long as the particles are excited by light with a predetermined peak wavelength and thereby emit light in a near-infrared wavelength band with a peak wavelength of 700 nm or greater and a wavelength width at half maximum of 100 nm or greater. It should be noted, when the maximum light intensity is set as 1.0 in a spectral distribution, the light intensity becomes 0.5 at two wavelength values on both sides of a wavelength value corresponding to the maximum light intensity; accordingly, a wavelength width in difference between the two wavelength values is obtained as "wavelength width at half maximum".

The visible light fluorescent material 18 is a member disposed on a region ranging from the upper face 22 of the solid light source 14 to an upper face 54 of the near-infrared fluorescent material 16. The visible light fluorescent material 18 contains visible light fluorescent particles 26. It should be noted that the condition regarding the visible light fluorescent material 18 "disposed on a region ranging from the upper face 22 of the solid light source 14 to an upper face 54 of the near-infrared fluorescent material 16" encompasses not only a condition that the upper face 22 of the solid light source 14 and the upper face 54 of the near-infrared fluorescent material 16 are entirely covered with the visible light fluorescent material 18 but also a condition that the upper face 22 of the solid light source 14 or the upper face 54 of the near-infrared fluorescent material 16 is not covered at least in part with the visible light fluorescent material 18.

The visible light fluorescent particles 26 are excited by light with a predetermined peak wavelength and emit visible light having, for instance, any one of the colors of violet, blue, green, yellow, orange, and red. For example, when excited by light with a peak wavelength of 365 nm, which is popular as light emitted from an LED exemplified as the solid light source 14, the visible light fluorescent particles 26 are configured to emit light (of green) with a peak wavelength of 520 nm.

It should be noted that the Stokes shift in the visible light fluorescent particles 26 (the visible light fluorescent material 18) is smaller than that in the fluorescent particles 24 (the near-infrared fluorescent material 16) described above; hence, heat generated in the visible light fluorescent material 18 is small in amount. Put differently, there is no concern that the visible light fluorescent material 18 per se becomes high in temperature and this brings about deterioration in luminous efficiency and reduction in product life.

The wall member 20 is a member disposed to stand upright from the front face 50 of the substrate 12. In the present exemplary embodiment, the wall member 20 stands upright from the circumferential edge of the front face 50 of the substrate 12. It should be noted that the wall member 20 may be integrated with the substrate 12, or alternatively, may be provided as a member (made of, for instance, metal or resin) separated from the substrate 12 as configured in the present exemplary embodiment. Besides, the wall member 20 is not a constituent element indispensable for the present invention.

With the wall member 20 herein disposed, the near-infrared fluorescent material 16 and/or the visible light fluorescent material 18 can be prevented from flowing out from the substrate 12. Incidentally, under an ordinary condition, part of rays of light emitted from the solid light source 14 transmits sidewards through the wall member 20 and is not used; however, when the inner surface of the wall member 20 is made of light-reflective material, the unused part of rays of light is reflected forward, whereby it is possible to brightly illuminate ahead.

Besides, in the present exemplary embodiment, the wall member 20 is disposed in adjacent to the outer peripheral edge of both the near-infrared fluorescent material 16 and the visible light fluorescent material 18.

(Features of Broadband Light-Emitting Device 10)

In the broadband light-emitting device 10 according to the present exemplary embodiment, the near-infrared fluorescent material 16 is adjacently disposed in the surroundings of the solid light source 14 so as to enclose the solid light source 14, and besides, is disposed in direct contact with the front face 50 of the substrate 12. On the other hand, the visible light fluorescent material 18 is disposed on the region ranging from the upper face 22 of the solid light source 14 to the upper face 54 of the near-infrared fluorescent material 16.

Figure 2:
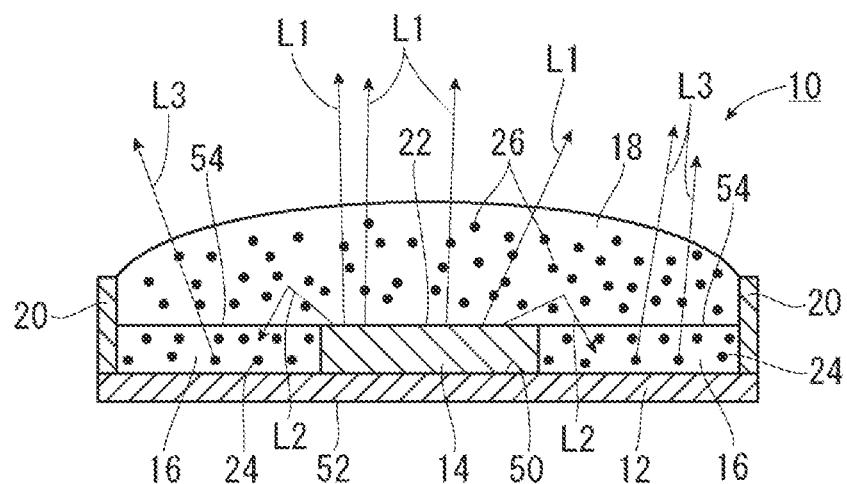
FIG. 2 is a cross-sectional diagram showing the flow of rays of light emitted from a solid light source (14)

With this configuration, as shown in FIG. 2, rays of light emitted from the upper face 22 of the solid light source 14 pass in part through the visible light fluorescent material 18 and are thus emitted as rays of visible light L1. On the other hand, the remaining of the rays of light emitted from the upper face 22 of the solid light source 14 is reflected inside the visible light fluorescent material 18, then enters the near-infrared fluorescent material 16 as rays of light L2, and excites the fluorescent particles 24 inside the near-infrared fluorescent material 16. Then, rays of light, generated by the excited fluorescent particles 24, are emitted as rays of near-infrared light L3. In this way, the broadband light-emitting device 10 can emit broadband light.

Preferably, the broadband light-emitting device 10 emits light with a continuous spectrum in a range from a spectral band of the light emitted by the solid light source 14 to 1500 nm. The condition of light "with a continuous spectrum in . . . " herein means that light intensity is not zero in the range from the spectral band of the light emitted by the solid light source 14 to 1500 nm.

It should be noted that "1500 nm" is preferable as the upper limit of the wavelength range because of the following reason. In general, many of spectroscopes calibrated by halogen lamps have a spectral sensitivity of around 340 nm to around 1200 nm. Hence, the fluorescent material emits light with a spectral curve gradually decreasing from the top to both ends in the shape of Gaussian curve. To measure a wavelength of 1200 nm, light is required to be emitted with a wavelength of not less than but greater than or equal to 1200 nm. Specifically, when light is emitted with a wavelength of 1500 nm, the intensity of light is sufficiently measurable at a wavelength of 1200 nm.

Besides, more preferably, the broadband light-emitting device 10 emits light with a continuous spectrum in a range from a spectral band of the light emitted by the solid light source 14 to 1200 nm.

It should be noted that "1200 nm" is more preferable as the upper limit of the wavelength range because of the following reason. In general, many of spectroscopes for measuring only visible light have a spectral sensitivity of around 340 nm to around 900 nm. Hence, the fluorescent material emits light with a spectral curve gradually decreasing from the top to both ends in the shape of Gaussian curve. To measure a wavelength of 900 nm, light is required to be emitted with a wavelength of not less than but greater than or equal to 900 nm. Specifically, when light is emitted with a wavelength of 1200 nm, the intensity of light is sufficiently measurable at a wavelength of 900 nm.

Figure 3:
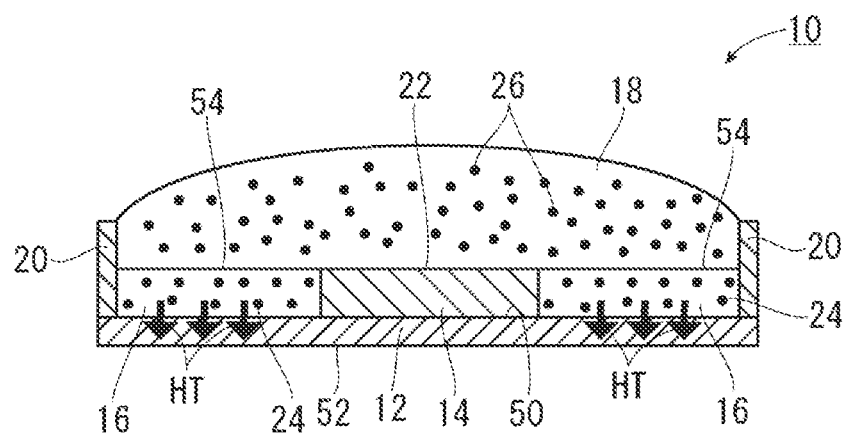
FIG. 3 is a cross-sectional diagram showing the flow of heat generated in a near-infrared fluorescent material (16)

Besides, the near-infrared fluorescent material 16 is disposed in direct contact with the front face 50 of the substrate 12 in the surroundings of the solid light source 14; hence, large Stokes shift can be achieved with respect to the light emitted from the solid light source 14. Besides, even when heat is generated in the near-infrared fluorescent material 16, the near-infrared fluorescent material 16 per se can be avoided from becoming high in temperature, because a large amount of heat is dissipated from the near-infrared fluorescent material 16 to the substrate 12 as shown in FIG. 3. It should be noted that in FIG. 3, arrows denoted by "HT" indicate dissipation of heat from the near-infrared fluorescent material 16.

(Modification 1)

In the exemplary embodiment described above, the near-infrared fluorescent material 16 is adjacently disposed in the surroundings of the solid light source 14 so as to enclose the solid light source 14. However, the positional relation of the near-infrared fluorescent material 16 with respect to the solid light source 14 is not limited to this. For example, a third member may be interposed between the solid light source 14 and the near-infrared fluorescent material 16 such that the near-infrared fluorescent material 16 is not disposed in adjacent to the solid light source 14. Alternatively, the near-infrared fluorescent material 16 may be disposed only in the vicinity of the solid light source 14 without enclosing the solid light source 14 in the surroundings thereof (Modification 2)

The exemplary embodiment described above has the configuration that a single type of the visible light fluorescent material 18 is disposed in the region ranging from the upper face 22 of the solid light source 14 to the upper face 54 of the near-infrared fluorescent material 16. Instead, a configuration shown in FIG. 4 may be employed that the visible light fluorescent material 18 is composed of three sections emitting different types of visible light.

Figure 4:
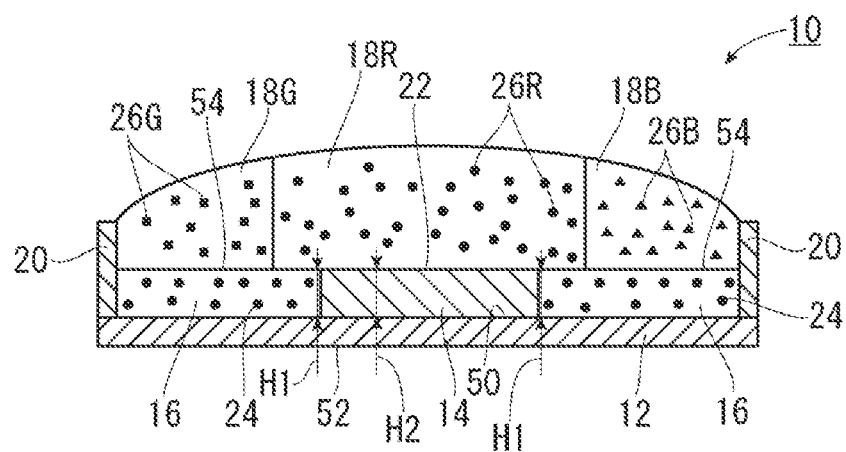
FIG. 4 is a cross-sectional diagram showing a type of broadband light-emitting device (10) according to modification 2.
Figure 5:
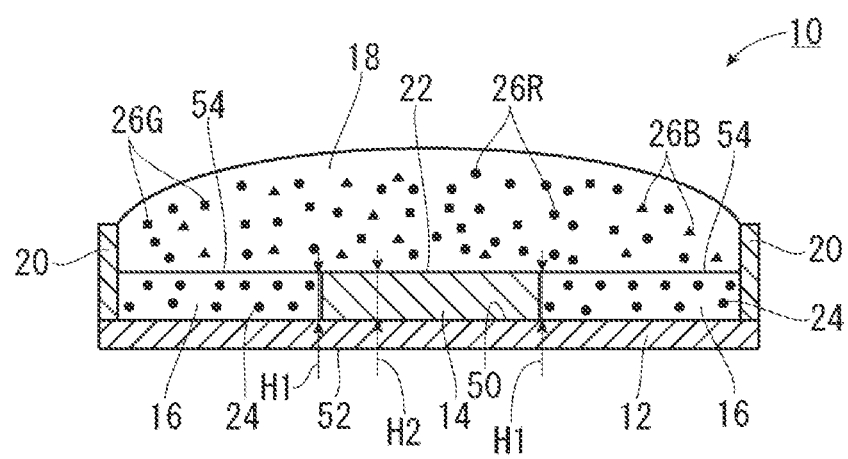
FIG. 5 is a cross-sectional diagram showing another type of broadband light-emitting device (10) according to the modification 2.

FIG. 4 exemplifies the configuration with visible light fluorescent materials 18G, 18R, and 18B. The visible light fluorescent material 18G contains visible light fluorescent particles 26G emitting visible light of green; the visible light fluorescent material 18R contains visible light fluorescent particles 26R emitting visible light of red; the visible light fluorescent material 18B contains visible light fluorescent particles 26B emitting visible light of blue. Here, the visible light fluorescent material 18R is configured to cover the entirety of the upper face 22 of the solid light source 14 and part of the upper face 54 of the near-infrared fluorescent material 16. On the other hand, the visible light fluorescent materials 18G and 18B are configured to cover the remaining of the upper face 54 of the near-infrared fluorescent material 16. It should be noted that in FIG. 4, the visible light fluorescent materials (18G, 18R, and 18B), containing different types of visible light fluorescent particles (26G, 26R, and 26B), are disposed as separate sections. Alternatively, as shown in FIG. 5, a plurality of types of visible light fluorescent particles (e.g., 26G, 26R, and 26B) may be disposed in mixture inside the visible light fluorescent material 18 provided as a single section.

Obviously, specific restrictions are not imposed on the layout of sections composing the visible light fluorescent material 18 and the color configuration for visible light emitted from the sections.

Although the invention has been described in its preferred form with a certain degree of particularity, it is understood that the present disclosure of the preferred form has been changed in the details of construction and the combination and arrangement of parts may be resorted to without departing from the spirit and scope of the invention as hereinafter claimed.

The disclosure of Japanese Patent Application No. 2021-119268 filed Jul. 20, 2021 including specification, drawings and claims is incorporated herein by reference in its entirety.

What is claimed is:

1. A broadband light-emitting device comprising:
a substrate;
a solid light source installed on a front face of the substrate, the solid light source emitting light at an upper face thereof;
a near-infrared fluorescent material disposed in direct contact with the front face of the substrate in a vicinity of the solid light source; and
a visible light fluorescent material disposed on a region ranging from the upper face of the solid light source to an upper face of the near-infrared fluorescent material, wherein
the near-infrared fluorescent material contains fluorescent particles exhibiting fluorescence in a near-infrared wavelength band with a peak wavelength of 700 nm or greater and a wavelength width at half maximum of 100 nm or greater.

2. The broadband light-emitting device according to claim 1, wherein a height from the front face of the substrate at a position nearest to the solid light source in the near-infrared fluorescent material is less than or equal to a height of the solid light source from the front face of the substrate.

3. The broadband light-emitting device according to claim 1, wherein the near-infrared fluorescent material is adjacently disposed in surroundings of the solid light source so as to enclose the solid light source.

4. The broadband light-emitting device according to claim 1, further comprising a wall member disposed to stand upright from the front face of the substrate on a circumferential edge of both the near-infrared fluorescent material and the visible light fluorescent material.

5. The broadband light-emitting device according to claim 1, wherein the visible light fluorescent material is divided into a plurality of sections so as to enable emission of a plurality of types of visible wavelength light.

6. The broadband light-emitting device according to claim 1, wherein the solid light source emits light with a peak wavelength of greater than or equal to 340 nm and less than or equal to 600 nm.

7. The broadband light-emitting device according to claim 1, wherein the broadband light-emitting device emits light with a continuous spectrum in a range from a spectral band of the light emitted by the solid light source to 1500 nm.

8. The broadband light-emitting device according to claim 1, wherein the broadband light-emitting device emits light with a continuous spectrum in a range from a spectral band of the light emitted by the solid light source to 1200 nm.

9. The broadband light-emitting device according to claim 1, wherein an LED (Light-Emitting Diode) or a laser diode is used as the solid light source.

* * * * *